(12) United States Patent
Dabiri et al.

(10) Patent No.: US 7,957,456 B2
(45) Date of Patent: Jun. 7, 2011

(54) SELECTION OF FILTER COEFFICIENTS FOR TRANCEIVER NON-LINEARITY SIGNAL CANCELLATION

(75) Inventors: Dariush Dabiri, San Jose, CA (US); Jose Tellado, Mountain View, CA (US)

(73) Assignee: PLX Technology, Inc., Sunnyvale, CA (US)

( * ) Notice: Subject to any disclaimer, the term of this patent is extended or adjusted under 35 U.S.C. 154(b) by 933 days.

(21) Appl. No.: 11/725,528

(22) Filed: Mar. 19, 2007

(65) Prior Publication Data

US 2008/0233903 A1  Sep. 25, 2008

(51) Int. Cl.
*H04B 1/38* (2006.01)
*H03H 7/40* (2006.01)

(52) U.S. Cl. .................................. 375/219; 375/232

(58) Field of Classification Search .................. 375/219, 375/221, 231, 232, 296, 350; 370/286, 290, 370/291; 379/3, 406.01, 406.08
See application file for complete search history.

(56) References Cited

U.S. PATENT DOCUMENTS

| | | | |
|---|---|---|---|
| 6,856,191 B2 | 2/2005 | Bartuni | |
| 6,934,387 B1 | 8/2005 | Kim | |
| 6,946,983 B2 | 9/2005 | Andersson et al. | |
| 2001/0038674 A1 | 11/2001 | Trans | |
| 2002/0008578 A1 | 1/2002 | Wright | |
| 2002/0065633 A1* | 5/2002 | Levin | 702/189 |
| 2004/0095994 A1* | 5/2004 | Dowling | 375/222 |
| 2005/0008084 A1* | 1/2005 | Zhidkov | 375/260 |
| 2005/0187759 A1* | 8/2005 | Malah et al. | 704/200 |

OTHER PUBLICATIONS

International Search Report, International Application No. PCT/US2008/057215, Selection of Filter Coeficients for Transceiver Non-Linearity Signal Cancellation.

* cited by examiner

*Primary Examiner* — Don N Vo
(74) *Attorney, Agent, or Firm* — Brian R. Short

(57) ABSTRACT

Embodiments of a method and apparatus for selecting coefficients of a non-linear filter are disclosed. The non-linear filter receives a transmit signal and generates a non-linear replica signal of a transmit DAC of a transceiver. The method include applying a plurality of periodic test pattern signals to inputs of the transmit DAC, wherein the periodic test pattern signals include a stream of symbols. Receive symbols are collected at an output of a receiver ADC of the transceiver resulting from the plurality of periodic test pattern signals. A non-linear map is generated that provides a value for each of n consecutive symbols input to the transmit DAC. Coefficients of the non-linear filter are selected based on the non-linear map.

24 Claims, 9 Drawing Sheets

SELECTION OF FILTER COEFFICIENTS FOR TRANCEIVER NON-LINEARITY SIGNAL CANCELLATION

RELATED APPLICATIONS

This application is related to U.S. patent application Ser. No. 11/373,928, titled "Transceiver Non-Linearity Cancellation", filed Mar. 13, 2006.

FIELD OF THE INVENTION

The invention relates generally to network communications. More particularly, the invention relates to a method and apparatus for selecting coefficients of a filter that generates transceiver non-linear cancellation signals.

BACKGROUND OF THE INVENTION

High-speed networks are continually evolving. The evolution includes a continuing advancement in the operational speed of the networks. The network implementation of choice that has emerged is Ethernet networks physically connected over unshielded twisted pair wiring. Ethernet in its 10/100BASE-T form is one of the most prevalent high speed LANs (local area network) for providing connectivity between personal computers, workstations and servers.

High-speed LAN technologies include 100BASE-T (Fast Ethernet) and 1000BASE-T (Gigabit Ethernet). Fast Ethernet technology has provided a smooth evolution from 10 Megabits per second (Mbps) performance of 10BASE-T to the 100 Mbps performance of 100BASE-T. Gigabit Ethernet provides 1 Gigabit per second (Gbps) bandwidth with essentially the simplicity of Ethernet. There is a desire to increase operating performance of Ethernet to even greater data rates.

FIG. 1 shows a block diagram of a pair of Ethernet transceivers communicating over a bi-directional transmission channel, according to the prior art. An exemplary transmission channel includes four pairs of copper wire 112, 114, 116, 118. The transceiver pair can be referred to as link partners, and includes a first Ethernet port 100 and a second Ethernet port 105. Both of the Ethernet ports 100, 105 include four transmitter $T_X$, receiver $R_X$, and I/O buffering sections corresponding to each of the pairs of copper wires 112, 114, 116, 118.

An implementation of high speed Ethernet networks includes simultaneous, full bandwidth transmission, in both directions (termed full duplex), within a selected frequency band. When configured to transmit in full duplex mode, Ethernet line cards are generally required to have transmitter and receiver sections of an Ethernet transceiver connected to each other in a parallel configuration to allow both the transmitter and receiver sections to be connected to the same twisted wiring pair for each of four pairs.

One result of full duplex transmission is that the transmit signals shares the same transmission channel as the receive signals, and some of the transmit signal processing shares at least some electronic circuitry with receive processing. Non-linearities of transmit signals can be generated within the transmitter section of the transceiver, and at least some of the non-linearities can be imposed onto the receive signal. The result is distortion of the receive signal.

Full duplex transmission can result in at least a portion of the transmit signal being coupled back into the receive signal. The portion of the transmit signal that couples back is referred to as an echo signal. Linear portions of the echo signal can be canceled by subtracting an approximate echo signal from the received signal. Generation of the echo cancellation signal, and cancellation process can also introduce non-linearities which can be imposed on the receive signal. The result is additional distortion of the receive signal.

Additionally, the receive signal itself can introduce non-linearities. For example, the receiver section typically includes an ADC which converts the analog receive signal into a digital stream. This ADC can introduce receive signal non-linearity.

It is desirable to have an apparatus and method for reducing non-linearity of a receive signal due to a transmission signal of a full-duplex transceiver. It is additionally desirable to reduce non-linearity of the receive signal due to echo signal cancellation.

SUMMARY OF THE INVENTION

An embodiment of the invention includes a method of selecting coefficients of a non-linear filter. The non-linear filter receives a transmit signal and generates a non-linear replica signal of a transmit DAC of a transceiver. The method include applying a plurality of periodic test pattern signals to inputs of the transmit DAC, wherein the periodic test pattern signals include a stream of symbols. Receive symbols are collected at an output of a receiver ADC of the transceiver resulting from the plurality of periodic test pattern signals. A non-linear map is generated that provides a value for each of n consecutive symbols input to the transmit DAC. Coefficients of the non-linear filter are selected based on the non-linear map.

Another embodiment includes a method of linearizing an Ethernet received signal of an Ethernet transceiver. The transceiver generates and combines a non-linear replica signal with the received signal reducing the non-linear transmission signal components imposed onto the receive signal, due to simultaneously transmitting a transmit signal, and receiving the receive signal. The non-linear replica signal is generated by non-linear filtering of the transmit signal. Coefficients of a non-linear filter that generates the non-linear replica signal are selected by applying a plurality of periodic test pattern signals to inputs of transmit DACs, collecting receive signals at an output of a receiver ADC of the transceiver resulting from the plurality of periodic test pattern signals, generating a non-linear map that provides a value for each of n consecutive symbols input to the transmit DACs, and selecting coefficients of the non-linear filter based on the non-linear map.

Other aspects and advantages of the present invention will become apparent from the following detailed description, taken in conjunction with the accompanying drawings, illustrating by way of example the principles of the invention.

BRIEF DESCRIPTION OF THE DRAWINGS

The present invention is readily understood by the following detailed description in conjunction with the accompanying drawings, wherein like reference numerals designate like structural elements, and in which.

DETAILED DESCRIPTION

Figure 1:
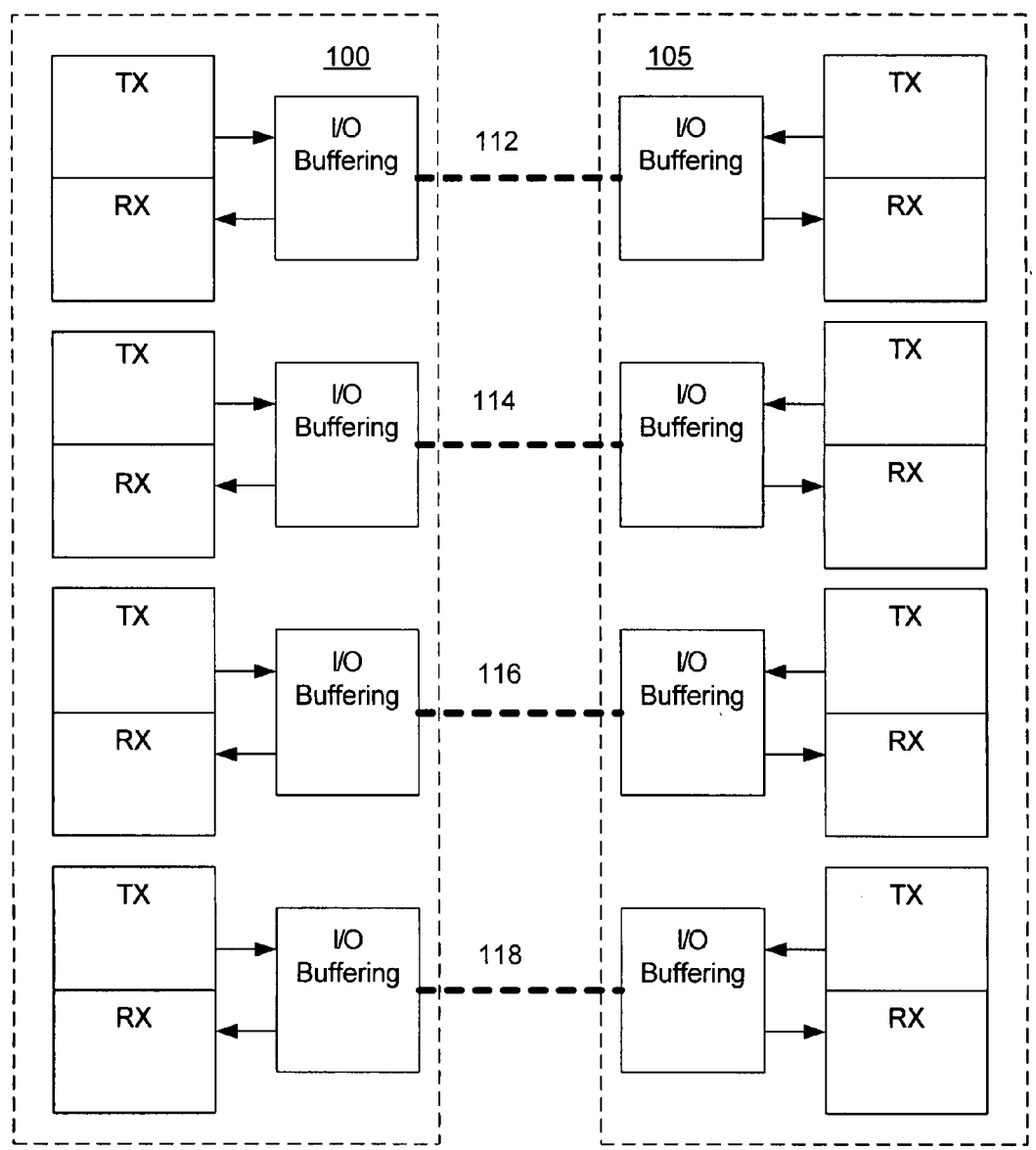
FIG. 1 shows a plurality of prior art Ethernet transceiver pairs.

As shown in the drawings for purposes of illustration, the invention is embodied in an apparatus and methods for selecting coefficients of a filter that can be used for linearizing receive signals of a transceiver. Non-linearities due to transmission signals, transmission echo cancellation signals that are imposed on receive signals can be reduced by generating non-linearity cancellation signals. The non-linearity cancellation signals can be generated by non-linear filtering of transmit signals and/or echo cancellation signals.

The descriptions provided are generally focused on Ethernet transceivers, but the embodiment can be used in other configurations of transceivers as well.

Figure 2:
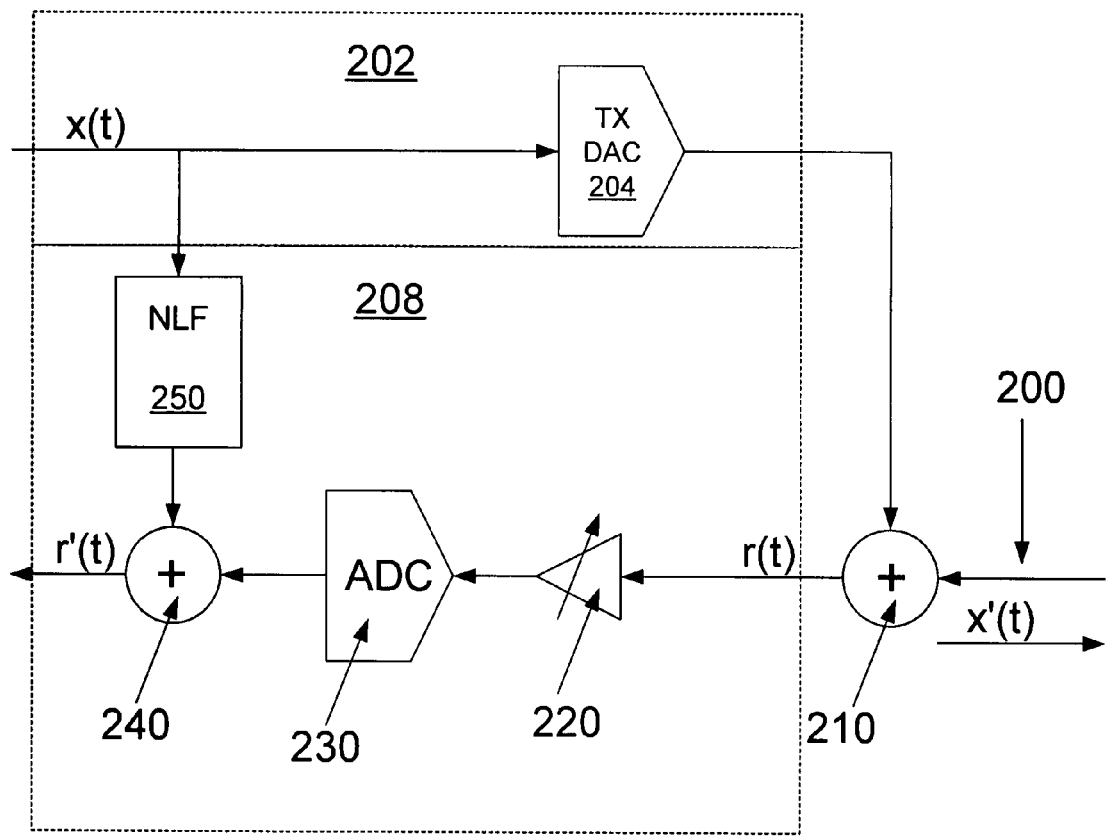
FIG. 2 shows a block diagram of one example of a transceiver that can utilizes methods of receive signal linearization.

FIG. 2 shows a block diagram of one example of a transceiver that can utilizes receive signal linearization. The transceiver includes a transmitter section 202 for transmitting a transmit signal x(t) and a receiver section 208 for receiving a receive signal r(t). A non-linear filter (NLF) 250 receives the transmit signal x(t) and generates a non-linear replica signal of non-linear transmit signal components imposed onto receive signal in the transceiver. A summer 240 negatively sums (combines) the replica with the receive signal to cancel non-linear transmit signal component of the receive signal. The non-linear replica signal is an estimate of the non-linear transmit signal components imposed on the receive signal.

The receiver section 208 can additionally include an adjustable gain amplifier 220, and analog to digital converter (ADC) 230.

Another summer 210 shown in FIG. 2 shows the transmit signal and the receive signal being connected to a common transmission channel 200. At least a portion of the transceiver, and the transmission channel 200 are shared by both the transmitter section and receiver section of the transceiver. An embodiment can include a hybrid circuit within the transceiver in which the transmit and receive signals are summed.

The digital transmission signal x(t) is passed through a transmission DAC 204 before transmission through the transmission channel 200, generating an analog transmission signal x'(t). The digital to analog conversion can create non-linear signal components that can be imposed on the receive signal. These non-linearities reduce the performance of the transceiver.

The non-linear replica signal generated by the non-linear filtering of the transmission signal reduces the non-linear components imposed on the receive signal by negatively summing the non-linear replica signal with the receive signal. The non-linear replica signal cancels the non-linear components imposed on the receive signal by, for example, the transmission DAC 204.

For this embodiment, the non-linear filter 250 receives a single input which can be the transmission signal x(t), and generates the non-linear replica signal. As will be described, the non-linear filtering can include linear combinations of known regressors. Coefficients of the non-linear filter 250 can be determined by correlating an output of a receiver ADC 230 with an output of a corresponding regressor within the filter. That is, as will be shown, each coefficient of the filter corresponds with a particular regressor. The adaptively determined value of the coefficient can be calculated by correlating the output of the corresponding regressor and the digitally sampled receive signal. Embodiments of the non-linear filter will be described.

Figure 3:
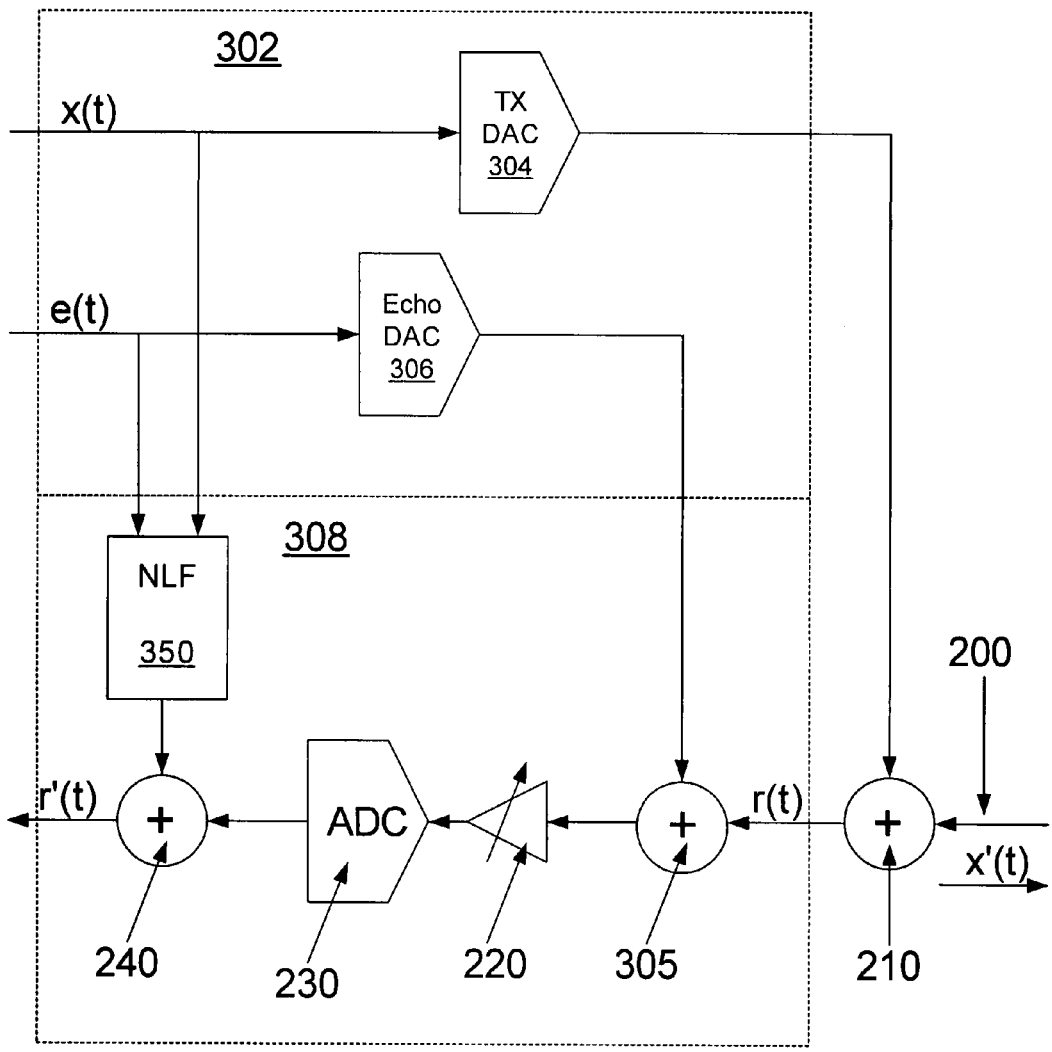
FIG. 3 shows a block diagram of another example of a transceiver that can utilized methods of receive signal linearization.

FIG. 3 shows a block diagram of another example of a transceiver that can utilize receive signal linearization. This transceiver additionally includes an echo signal canceller 305. The direct connection between the transmitter section and the receiver section typically causes at least a portion of transmitter signals to be additionally received by the receiver, resulting in an echo signal. An echo cancellation signal e(t) can be generated, for example, by filtering the transmission signal. The echo cancellation signal e(t) is summed with the receive signal to mitigate the effects of the echo signal. Alternatively, the echo cancellation signal e(t) is set to be the transmission signal x(t).

The echo cancellation signal can generate non-linearities as well. For example, an echo signal DAC 306 can generate non-linear signal components that can be imposed on the receive signal. A non-linear filter 350 can filter the transmission signal x(t) (and in other embodiments, the echo signal e(t)) generating the non-linear replica signal. The non-linear replica signal is combined with the receive signal, reducing the non-linearites of the receive signal as imposed by the transmit signal DAC non-linearities and the echo signal DAC non-linearities. FIG. 3 shows cancellation of non-linearities of both DACs. However, the transceiver can include only cancellation of transmit signal DAC non-linearites as shown in FIG. 2, or alternatively, the transceiver can include only cancellation of echo signal DAC non-linearities.

As described, the non-linear filter 350 includes input x(t) and generates a single output (the non-linear replica signal). Coefficients of the non-linear filter can be determined by correlating an output of a receiver ADC 230 with an output of a corresponding regressor within the filter.

The either or both of the DACs 304, 306 can be oversampled. That is, the sampling rate of the DACs 304, 306 can be set to a rate that is greater than the symbol rate of the symbol stream being received by the DACs 304, 306. Therefore, the linearizing is performed on over-sampled signals. The symbol rate can be, for example, 800 MHz. Over-sampling can be used for all of the different methods of signal linearization discussed.

Figure 4:
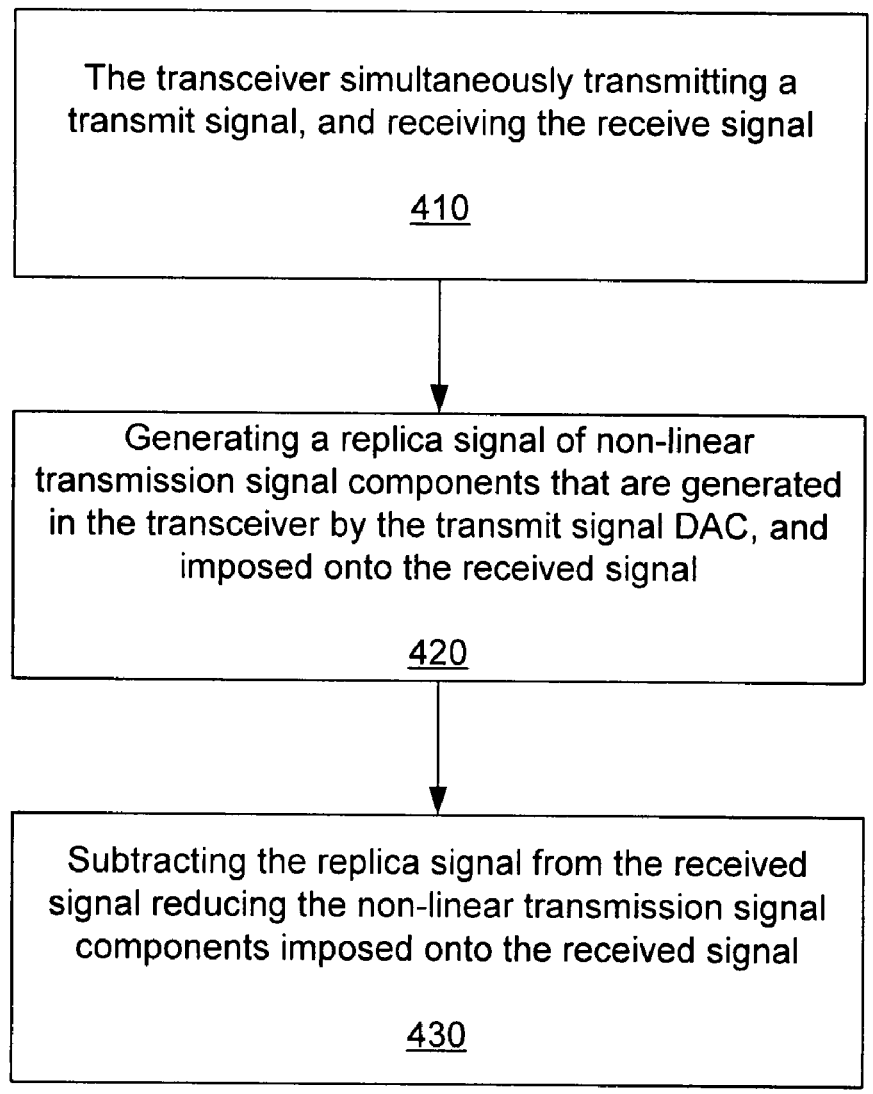
FIG. 4 is a flow chart of one example of a method of linearizing a receive signal of a transceiver.

FIG. 4 is a flow chart of an exemplary method of linearizing a receive signal of a transceiver. A first step 410 includes the transceiver simultaneously transmitting a transmit signal, and receiving the receive signal. A second step 420 includes generating a non-linear replica signal of non-linear transmission signal components that are generated in the transceiver by the transmit signal, and coupled onto the received signal. A third step 430 includes subtracting the non-linear replica signal from the received signal reducing the non-linear transmission signal components coupled onto the received signal.

Figure 5:
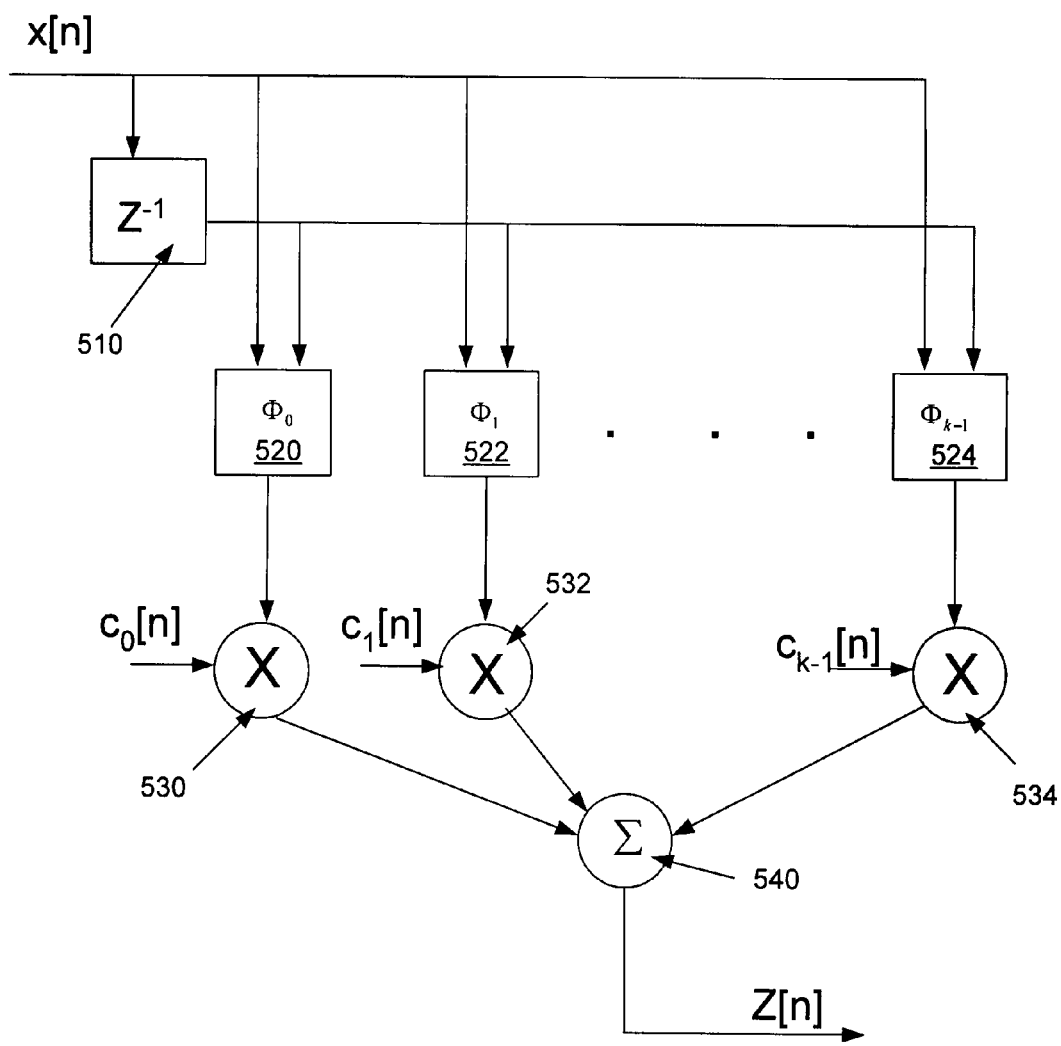
FIG. 5 shows a block diagram of one example of a single input non-linear filter.

FIG. 5 shows a block diagram of an exemplary single input non-linear filter. This non-linear filter configuration can be particularly adaptable for use within an Ethernet transceiver that has non-linearity components due to a transmitter DAC imposed on a receive signal.

This implementation includes a delay 510. The input x[n] and a delayed version of x[n] (x[n−1]) are connected to multiple regressors 520, 522, 524. Outputs of the regressors are multiplied by coefficients $c_0[n]$, $c_{k-1}[n]$ . . . $c_{k-1}[n]$ and summed, generating a filter output Z[n]. Only one delay is shown in FIG. 5, but additional delays can be used generating x[n], x[n−1], x[n−2] . . . .

Regressors

The term regressor is commonly used in the field of statistics. An implementation of a regressor can include implementing or selecting a function. Exemplary functions that can be selected include polynomials, sinusoidal functions, splines, and wavelets. The function selection for the non-linear filters used for reducing non-linearities of receive signals is based upon prior knowledge of the non-linearities. More specifically, the function selection is based upon prior knowledge regarding the transmission DAC and/or the echo DAC non-linearities, and/or receive signal non-linearities. Once a function has been selected, the selected function can be fine-tuned based upon the prior knowledge of the DAC non-linearities.

When in operation, the regressors are pre-selected and do not change. The coefficients adaptively change as will be described.

Selection of Coefficients of the Non-Linear Filter

Figure 6:
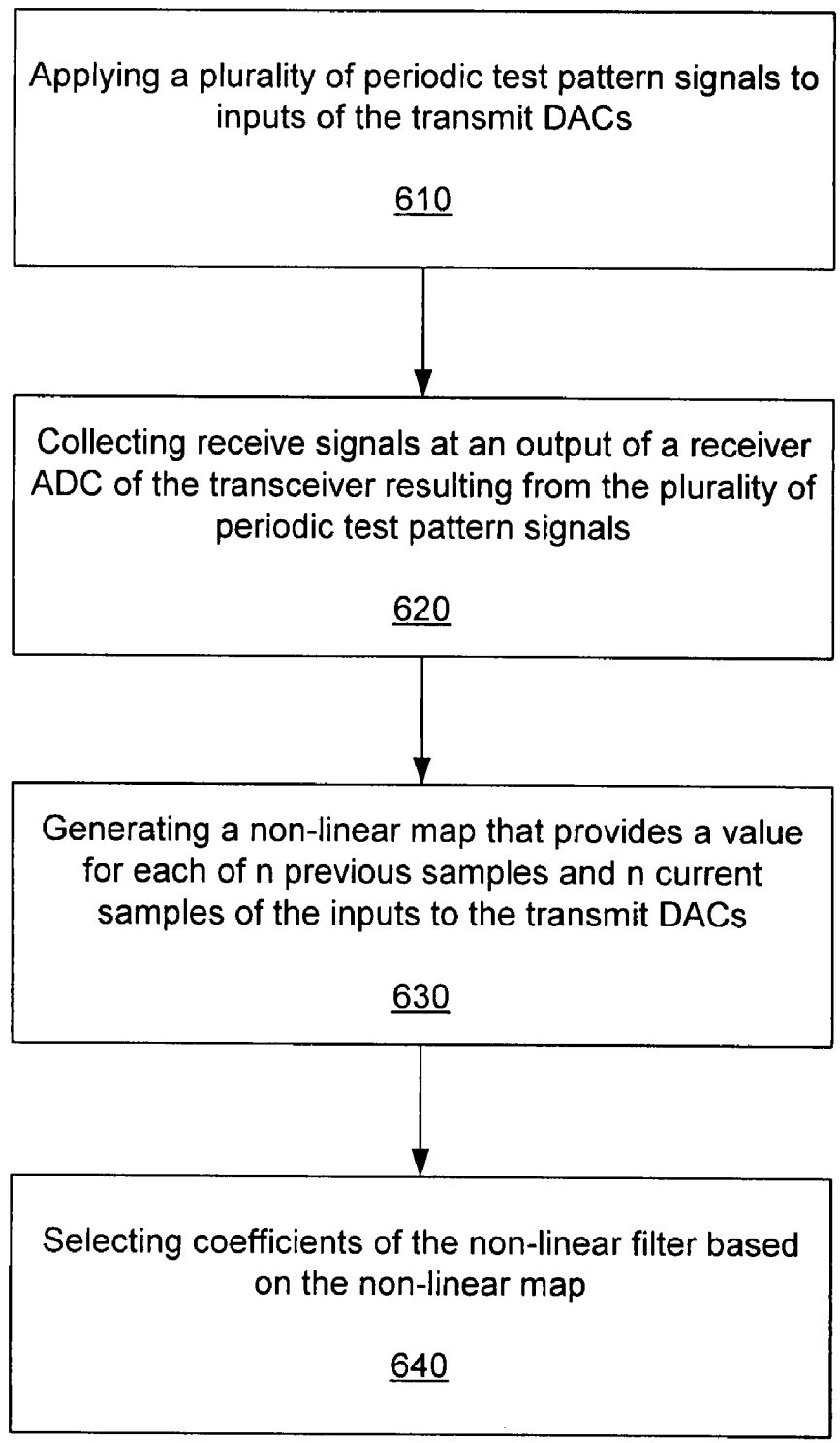
FIG. 6 is a flow chart showing step of one example of a method of selecting the coefficients of a non-linear filter.

FIG. 6 is a flow chart that includes the steps of one method of selecting coefficients of a non-linear filter, the non-linear filter receiving a transmit signal and generating a non-linear replica signal of a transmit DAC of a transceiver. A first step 610 of the method includes applying a plurality of periodic test pattern signals to inputs of the transmit DAC. The transmit DAC can additionally include an echo signal DAC. A second step 620 includes collecting receive symbols at an output of a receiver ADC of the transceiver resulting from the plurality of periodic test pattern signals. A third step 630 includes generating a non-linear map that provides a value for each of n consecutive symbols input to the transmit DAC. A fourth step 640 includes selecting coefficients of the non-linear filter based on the non-linear map.

As will be described, the application of the periodic test patterns allows for averaging out the effects of noise. Additionally, different test patterns are selected for determination of the non-linear DAC components that correspond with fundamental frequencies of the different test patterns. That is, analysis of the collected receive symbols for a single test pattern can yield an estimate of the non-linear components that do not fall on fundamental frequency components of that particular pattern, but does not allow for determination of non-linear components that do fall on the fundamental frequencies. The application of different patterns allows for determination of the non-linear components at the fundamental frequencies of the test patterns.

Consecutive Samples

The number of consecutive samples is typically chosen to be two consecutive samples. However, more than two consecutive samples can be used. The dimensions of the resulting non-linear map, and associated matrices (M and D matrices will be described) varies depending upon the number of consecutive samples used, as does the complexity of the processing circuitry.

The number of n consecutive samples is variable. The number n can be selected based upon the contributors to the non-linearity. The non-linearity depends on n consecutive symbols, and n can vary depending upon how many DAC symbols contribute to each sample of the non-linearity signal.

Generation of Non-Linear Map

One embodiment of the map is an m×m matrix, in which each matrix element provides a value which corresponds with consecutive symbol values. That is, a first symbol defines one dimension, and the next consecutive symbol defines the other dimension. The values of the symbols can vary the entire range of the transmitter DACs. If the transmitter DAC is a 12 bit DAC, then range (m) can vary from zero to $2^{12}$, and the size of the map can be as large as $2^{12} \times 2^{12}$.

One embodiment of constructing the map includes generating an M matrix and a D matrix. For this exemplary embodiment, the m×m M matrix is generated consists of a summation of the resulting values of the collected receive signals for matrix elements identified by each of concurrent samples (previous samples and current samples). The m×m D matrix is generated by summing a number of times each element as identified by each of the previous samples and each of the current samples is used by the plurality of test patterns. The non-linear map is generated by dividing each element value of the M matrix with a corresponding element value of the D matrix.

As previously described, with 12 bit transmitter DACs, the M matrix, D matrix and the non-linear map can include as many as $2^{12} \times 2^{12}$ elements, which is relatively large, and requires relatively large amounts of storage and processing. Therefore, it can be desirable to reduce the size of these matrices. One embodiment includes using only a subset of the $2^{12} \times 2^{12}$ elements. For example, only the most significant bits (MSBs), for example, six MSBs of the inputs to the DACs are used to compute the M matrix and the D matrix. Alternatively, only the most least significant bits (LSBs), for example, six LSBs of the inputs to the DACs are used to compute the M matrix and the D matrix.

Separate treatment of MSBs and LSBs is common in the design and use of DACs in which the coding of the MSBs and the LSBs follow thermometer and binary schemes, respectively. This separation allows for significant reduction in the complexity of the canceller. For example, if 6 MSBs and 6 LSBs are used for the construction of two separate matrices the total number of elements is 8192 whereas a single combined matrix has 224 elements.

The non-linear map is generally still considered to be large, and can be sensitive to noise. Therefore, in some situations, it is desirable to perform additional processing on the non-linear map to both compress the map, and to reduce the effects of noise. This additional processing can include more compression, and de-noising of the non-linear map.

One method of compressing the non-linear map and de-noising the map includes wavelet transforming on the map. A wavelet transform localizes a function both in space and scaling and has some desirable properties compared to the Fourier transform.

The non-linear map can be compressed by wavelet transforming the non-linear map, and eliminating elements of the transformed map that have a value of zero, or at least have a value below a threshold. The threshold can be adjusted to provide a desirable trade-off between performance and complexity. Generally, decreasing the threshold will increase the number of coefficients, and therefore, increases the complexity. However, decreasing the threshold provides an increased resolution, and therefore, can improve the performance. The threshold can be increased when the signals are noisy, and decreased when the signals are less noisy.

The non-linear map can be de-noised by wavelet transforming the non-linear map, and analyzing variations of values of the elements of the wavelet transformed map. More generally, the non-linear map is transformed. Examples of transforms include, but are not limited to, cosine-transforms, wavelet transforms and Fourier transforms. For noisy signals, eliminating coefficients that fall below a properly chosen threshold eliminates components of signals that are the most affected by the noise, and improves the overall signal to noise ratio of the non-linear map.

Another embodiment of the non-linear map can be generated for the situation in which the non-linear filter receives the x(t) and e(t) inputs as shown in FIG. 3. In this case, the non-linear map further provides a value for each of m consecutive symbols input to the echo signal cancellation DAC. It is to be noted that the values of n and m do not have to be the same.

Selection of Periodic Test Patterns

The periodic test patterns allow for averaging out of noise, and for allowing determination of the DAC non-linear components. The repetition of periodic test signal allows for noise to be averaged out, but the averaging does not allow for the determination of the non-linear DAC components that occur at the fundamental frequencies of the periodic test patterns. Multiple test patterns that include varying fundamental frequency components allow for determination of transmission DAC non-linearities that occur at the fundamental frequencies.

For one embodiment, the test patterns each include a sum of a few different sinusoids, that can be referred to as fundamental tones. The number of fundamental tones is kept relatively low, as the non-linearity signal at the non-fundamental tones are readily available. The non-linearity signal at the fundamental tones can only be estimated after additional processing. For this embodiment, however, it can be difficult to keep the ratio of the peak energy of the test pattern to its average energy low, in order to exercise all the bits of the DACs. To reduce the ratio of the peak energy to the average energy, the phase of the sinusoids can be carefully adjusted. For example, the tones can be ordered in an ascending order and the phase of each sinusoid can be adjusted proportionally to the sum of the frequencies of the preceding sinusoids.

For another embodiment, the frequency and/or the phase of the sinusoids are dithered, which can provide a better peak power to average power of each test pattern. Small changes in the phase and/or frequency of the sinusoids can be applied randomly until the peak to average ratio improves.

For another embodiment, the frequency and/or the phase of the sinusoids are randomly selected. The test patterns for one embodiment includes a small number of fundamental tones (such as, two) in which the frequency and/or phase of the small number of fundamental tones is randomly selected. Since the number of tones is small, the worst case peak to average ratio is a small number. Generally, the peak to average ratio increases as the number of selectable tones increases.

Determination of the Non-Linear Filter Coefficients from the Non-Linear Map

For one embodiment, the coefficients of the non-linear filter correspond one for one with the values of the elements within the non-linear map. Each regressor can be simplified and represented as an indicator function having a value of one for each non-zero element of the non-linear map, and a value of zero (non-existent) elsewhere. For another embodiment, the non-linear filter includes the regressors being represented as a wavelet, and the coefficients determined by wavelet transforming the non-linear map.

Figure 7:
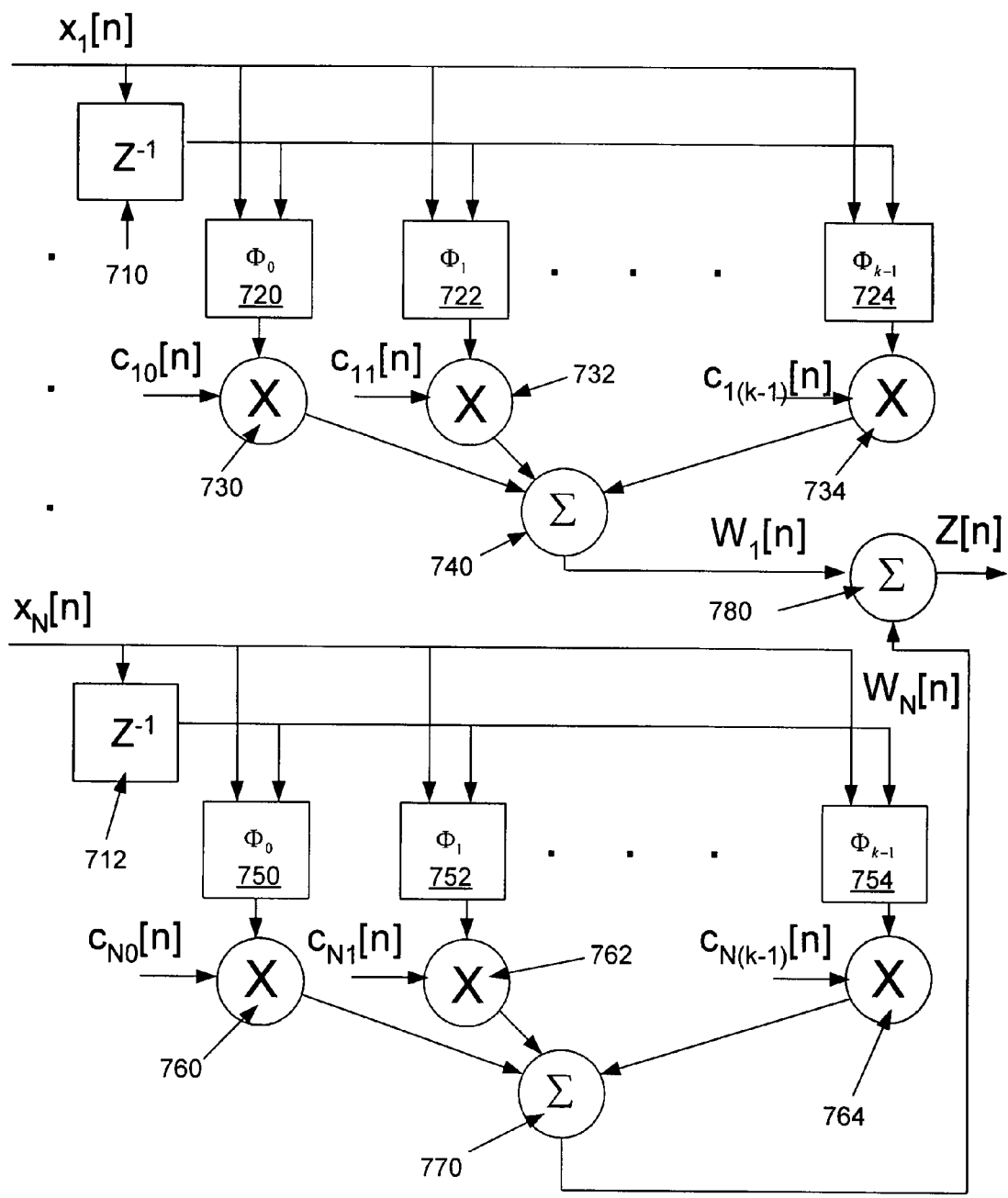
FIG. 7 shows a block diagram of one example of a multiple input non-linear filter.

FIG. 7 shows a block diagram of an exemplary multiple (N) input non-linear filter. This non-linear filter configuration is particularly adaptable for use within an Ethernet transceiver that has non-linearity components due to a transmitter DAC, and non-linearity components due to a echo DAC, imposed on a receive signal. The coefficients for this filter can be determined using the methods as described.

This implementation includes delays 710, 712. A first input section receives a first input $x_1[n]$. The first input $x_1[n]$ and a delayed version of $x_1[n]$ are connected to a set of multiple regressors 720, 722, 724. Outputs of the sets of regressors are multiplied by coefficients $c_{10}[0]$, $c_{11}[1]$ ... $c_{1(k-1)}[k-1]$ through multipliers 730, 732, 734 and summed at a summer 740 generating a first section output $W1[n]$.

An Nth input section receives an Nth input $x_N[n]$. The Nth input $x_N[n]$ and a delayed version of $x_N[n]$ are connected to a set of multiple regressors 750, 752, 754. Outputs of the sets of regressors are multiplied by coefficients $c_{N0}[n]$, $C_{N1}[n]$ ... $c_{N(k-1)}[n]$ through multipliers 760, 762, 764 and summed at a summer 770 generating an Nth section output $W_N[n]$.

FIG. 7 only shows two sections. However, clearly N can be any desired number. The non-linear filter includes N sections. The outputs of the N section of the non-linear filter are summed at a summer 780, generating the non-linear replica signal Z[n].

One example of a method of adaptively determining values of the coefficients $c_{10}[0]$, $c_{10}[n]$ ... $c_{1(k-1)}[n]$ for the first section includes correlating the digital receive signal from the receiver ADC with outputs of the regressors 720, 722, 724. For example, the value of the coefficient $c_{10}[n]$ is determined by correlating the digital receive signal with the output of the regressor 720, the value of the coefficient $c_{11}[n]$ is determined by correlating the digital receive signal with output of the regressor 722 and the value of the coefficient $c_{1(k-1)}[n]$ is determined by correlating the analog digital signal with the output of the regressor 724.

One example of a method of adaptively determining values of the coefficients $c_{N0}[n]$, $c_{N1}[n]$ ... $c_{N(k-1)}[n]$ for the Nth section includes correlating the digital receive signal from the receiver ADC with outputs of the regressors 750, 752, 754. For example, the value of the coefficient $c_{N0}[n]$ is determined by correlating the digital receive signal with the output of the regressor 750, the value of the coefficient $c_{11}[n]$ is determined by correlating the digital receive signal with output of the regressor 752 and the value of the coefficient $c_{N(k-1)}[n]$ is determined by correlating the analog digital signal with the output of the regressor 754.

The multiple inputs to the non-linear filter can be any combination of the transmit signal, the echo signal and the receive signal. The non-linear filter configuration shown in FIG. 7 is an example. Other configurations of non-linear filters could alternatively be used.

Adaptively Updating the Coefficients of the Non-Linear Filter

It can be desirable to update the values of the coefficients when the transceiver is operating in normal operation. External factors, such as, temperature, can cause the non-linear filter coefficients needed to cause cancellation of the non-linear transmit DAC signals to change. For an embodiment, during normal operation of the transceiver, the coefficients are adaptively updated as determined by non-linearity signals sensed within receiver circuitry of the transceiver.

Figure 8:
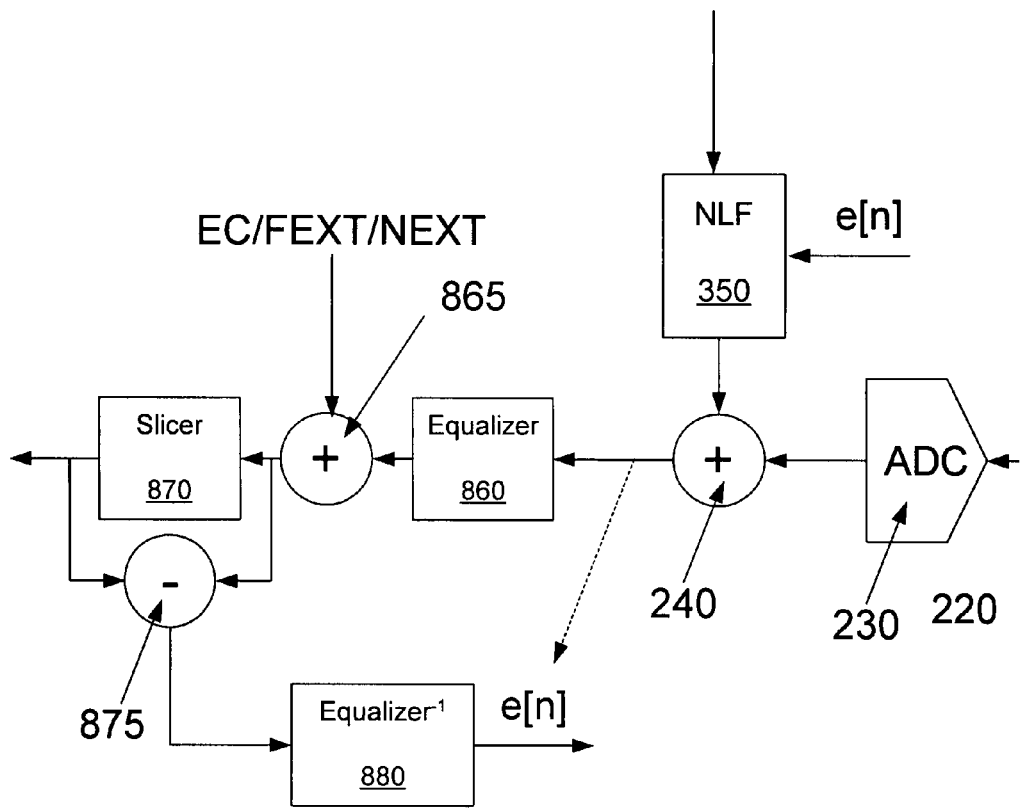
FIG. 8 shows an example of receiver chain circuitry that generates an non-linearity error signal that can be used to adaptively update the coefficients of the non-linear filter.

FIG. 8 shows a block diagram of a receiver chain that generates an error signal that can be used to adaptively update the coefficients of the non-linear filter. As previously described, the receiver chain includes the ADC 230 and the non-linear filter 350. The non-linear replica signal generated by the non-linear filter 350 is summed (at the summer 240) with the receive signal at the output of the ADC 230. The non-linear corrected signal is typically passed through an equalizer 860, and other error cancellation signals are summed, for example, at a summer 860. The other error cancellation signals can include, for example, echo cancellation (EC), FEXT and NEXT cancellation signals. The error canceled receive signal is typically passed through a slicer 870. The input and the output of the slicer 870 can be negatively summed (at negative summer 875), and the resulting signal passed through an inverted equalizer 880, yielding a non-linear error signal e[n], not to be confused with the earlier described e(t). Given that the other error signals have been cancelled, the remaining error is assumed to residual non-linearity errors due to drift caused by, for example, a change in temperature.

A least mean square (LMS) algorithm, for example, can be used to adaptively update the coefficients of the non-linear filter based on the error signal e[n]. That is, algorithmically, the coefficient can be adaptively updated per the following equation:

$c_k[n]=c_k[n-1]-\mu e[n]\Phi_k(x[n], x[n-1])$, in which $\mu$ is an adaptation coefficient that is selected to minimize adaptation noise, and $\Phi_k$ is the regressor used in the non-linear filter.

Each coefficient of the non-linear filter is adaptively updated based on the error signal e[n].

A Network of Devices

Figure 9:
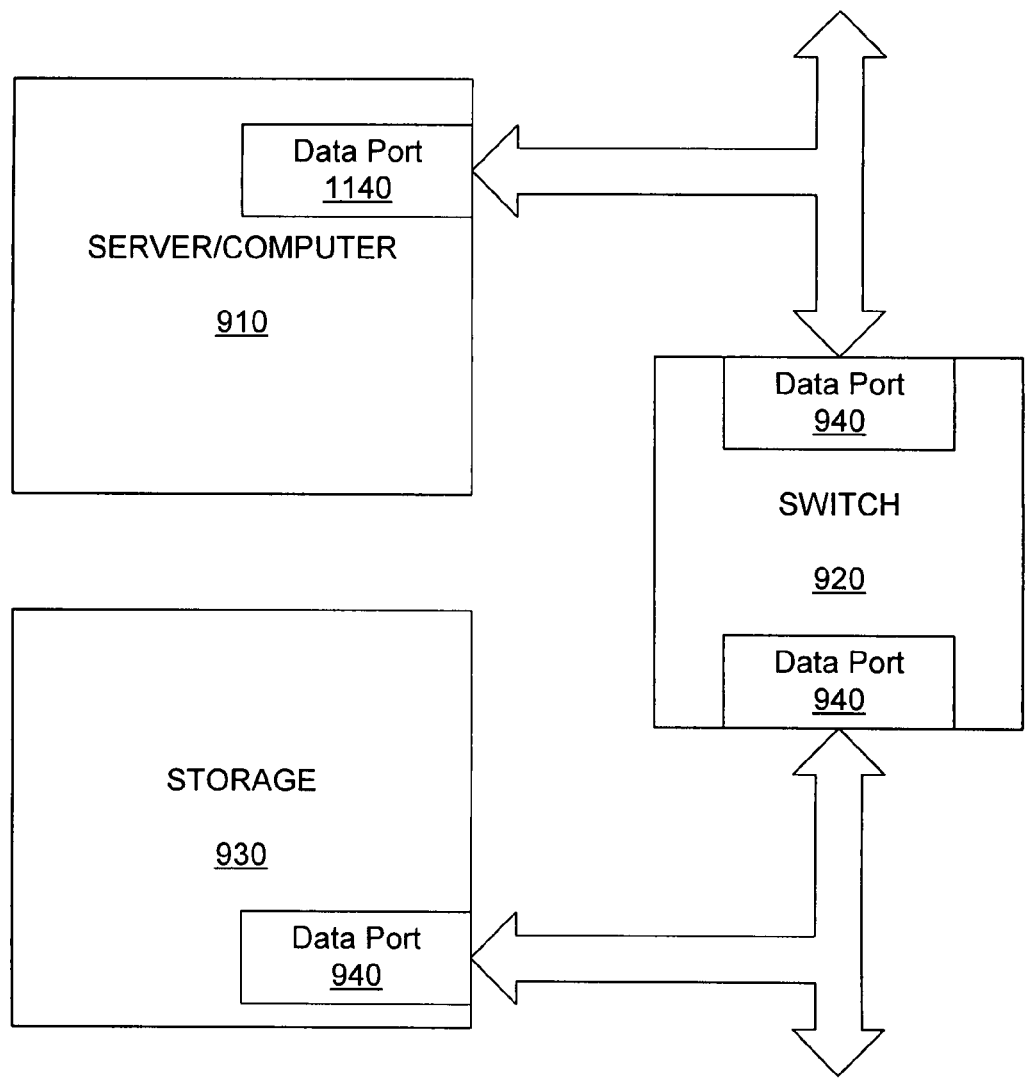
FIG. 9 shows devices connected to an Ethernet network that can include embodiments of the receive signal linearization.

FIG. 9 shows devices connected to an Ethernet network that can include embodiments of the transceiver linearizing. The network includes a server/computer 910, a switch 920 and storage 930 that can all benefit from the use of a linearized transceiver 940. The server/computer 910 can be connected to the switch 920 through an Ethernet twisted pair LAN connection. The switch 920 can additionally be connected to the storage 930 through an Ethernet twisted pair LAN connection. The linearized transceivers 940 within the server/computer 910, the switch 920, and the storage 930 can provide reduction of non-linear signal components of receive signals.

Although specific embodiments of the invention have been described and illustrated, the invention is not to be limited to the specific forms or arrangements of parts so described and illustrated. The invention is limited only by the appended claims.

What is claimed:

1. A method of selecting coefficients of a non-linear filter, the non-linear filter receiving a transmit signal and generating a non-linear replica signal of a transmit DAC of a transceiver, the method comprising:
    applying a plurality of periodic test pattern signals to inputs of the transmit DAC, the periodic test pattern signals comprising a stream of symbols;
    collecting receive symbols at an output of a receiver ADC of the transceiver resulting from the plurality of periodic test pattern signals;
    generating a non-linear map that provides a value for each of n consecutive symbols input to the transmit DAC;
    selecting coefficients of the non-linear filter based on the non-linear map; and
    summing the non-linear replica signal of the non-linear filter with the output of the receiver ADC, thereby reducing non-linear signal components of the transmit DAC of the transceiver.

2. The method of claim 1, wherein the consecutive symbols comprise two consecutive symbols, and the non-linear map provides a value for each of the two consecutive symbols.

3. The method of claim 1, further comprising subtracting out fundamental tones of the periodic test patterns, yielding non-linear DAC components of the receive symbols.

4. The method of claim 1, wherein generating a non-linear map that provides a value for each of n consecutive symbols of the inputs to the DAC comprises: generating an m×m M matrix representing a summation of the resulting values of the collected receive symbols for matrix elements identified by each of the consecutive samples;
    generating an m×m D matrix by summing a number of times each element as identified by each of the consecutive samples is used by the plurality of test patterns.

5. The method of claim 4, wherein only least significant bits of inputs to the DAC are used to compute the M matrix and the D matrix.

6. The method of claim 4, wherein only most significant bits of inputs to the DAC are used to compute the M matrix and the D matrix.

7. The method of claim 4, wherein generating the non-linear map comprises dividing each element value of the M matrix with a corresponding element value of the D matrix.

8. The method of claim 4, wherein generating the non-linear map further comprises averaging values of entries of the non-linear map.

9. The method of claim 8, wherein averaging values of the entries comprises low pass filtering the values of the entries of the non-linear map.

10. The method of claim 8, wherein generating the non-linear map further comprises at least one of:
    compressing the non-linear map;
    de-noising the non-linear map.

11. The method of claim 10, wherein compressing the non-linear map comprises wavelet transforming the non-linear map and eliminating map elements having a value of zero.

12. The method of claim 10, wherein compressing the non-linear map comprises wavelet transforming the non-linear map and eliminating map elements having a value less than a threshold.

13. The method of claim 10, wherein de-noising the non-linear map comprises wavelet transforming the non-linear map and analyzing variations of values of the elements of the wavelet transformed map.

14. The method of claim 10, wherein de-noising the non-linear map comprises transforming the non-linear map and analyzing variations of values of the elements of the transformed map.

15. The method of claim 1, wherein the plurality of periodic test patterns comprise a plurality of sinusoids ordered by frequency, wherein a phase of each sinusoid is proportional to a sum of preceding sinusoids.

16. The method of claim 15, further comprising dithering at least one of frequency and phase of the sinusoids, thereby achieving a better peak power to average power of each test pattern.

17. The method of claim 15, further comprising randomly selecting at least one of frequency and phase of the sinusoids, thereby achieving a better peak power to average power of each test pattern.

18. The method of claim 1, wherein selecting coefficients of the non-linear filter based on the non-linear map comprises a one for one correspondence with elements of the non-linear map.

19. The method of claim 1, wherein the transmit DAC comprises a transmit signal DAC, and includes an echo signal cancellation DAC.

20. The method of claim 1, wherein generating a non-linear map that provides a value for each of n consecutive symbols input to the transmit DAC and selecting coefficients of the non-linear filter based on the non-linear map, occurs before normal operation of the transceiver.

21. The method of claim 1, further comprising:
    during normal operation of the transceiver, adaptively updating the coefficients as determined by non-linearity signals sensed within receiver circuitry of the transceiver.

22. The method of claim 21, wherein sensing the non-linearity signal within the receiver circuitry of the transceiver comprises:

summing echo current, FEXT and NEXT error correction signals with the output of the receiver ADC;
sensing the non-linearity signal by detecting a remaining amount of error signal.

23. A method of linearizing an Ethernet received signal of a transceiver, comprising:
selecting coefficients of a non-linear filter, the non-linear filter receiving a transmit signal and generating a non-linear replica signal of transmit DACs of the transceiver, the method comprising:
applying a plurality of periodic test pattern signals to inputs of the transmit DACs;
collecting receive signals at an output of a receiver ADC of the transceiver resulting from the plurality of periodic test pattern signals;
generating a non-linear map that provides a value for each of n consecutive symbols input to the transmit DACs;
selecting coefficients of the non-linear filter based on the non-linear map;
the transceiver simultaneously transmitting a transmit signal, and receiving the receive signal;
combining the non-linear replica signal with the received signal reducing the non-linear transmission signal components imposed onto the receive signal.

24. An Ethernet transceiver comprising:
a transmitter for transmitting a transmit signal;
a receiver for receiving a receive signal;
a non-linear filter for receiving the transmit signal and generating a non-linear replica signal of non-linear transmit signal DAC components imposed onto receive signal in the transceiver;
means for selecting coefficients of the non-linear filter, comprising;
means for applying a plurality of periodic test pattern signals to inputs of transmit DACs;
means for collecting receive signals at an output of a receiver ADC of the transceiver resulting from the plurality of periodic test pattern signals;
means for generating a non-linear map that provides a value for each of n consecutive symbols input to the transmit DACs;
means for selecting coefficients of the non-linear filter based on the non-linear map;
a summer for combining the non-linear replica signal with the receive signal to cancel non-linear transmit signal DAC components of the receive signal.

* * * * *